United States Patent [19]

Scepanovic et al.

[11] Patent Number: 5,796,625
[45] Date of Patent: Aug. 18, 1998

[54] PHYSICAL DESIGN AUTOMATION SYSTEM AND PROCESS FOR DESIGNING INTEGRATED CIRCUIT CHIP USING SIMULATED ANNEALING WITH "CHESSBOARD AND JIGGLE" OPTIMIZATION

[75] Inventors: Ranko Scepanovic; James S. Koford, both of San Jose, Calif.; Alexander E. Andreev, Moskovskaja Oblast, Russian Federation; Ivan Pavisic, Cupertino, Calif.

[73] Assignee: LSI Logic Corporation, Milpitas, Calif.

[21] Appl. No.: 609,359

[22] Filed: Mar. 1, 1996

[51] Int. Cl.⁶ .................................................. G06F 17/50
[52] U.S. Cl. .......................... 364/491; 364/490; 364/148; 395/500
[58] Field of Search ........................ 364/489, 490, 364/491, 148; 395/500, 821, 800, 840

[56] References Cited

U.S. PATENT DOCUMENTS

| 4,495,559 | 1/1985 | Gellatt, Jr. et al. | 364/148 |
|---|---|---|---|
| 5,187,668 | 2/1993 | Okude et al. | 364/468 |
| 5,475,608 | 12/1995 | Masuoka | 364/491 |
| 5,495,419 | 2/1996 | Rostoker et al. | 364/468 |

OTHER PUBLICATIONS

*VLSI Cell Placement Techniques*, K. Shahookar and P. Mazumder, ACM Computing Surveys vol. 23, No. 2, Jun. 1991.

*TimberWolf 3.2: A New Standard Cell Placement and Global Routing Package*, C. Sechen and A. Sangiovanni-Vincentelli, IEEE 23rd Design Automation Conf., 1986, Paper 26.1.

*Placement of Standard Cells Using Simulated Annealing on the Connection Machine*, A. Casotto and A. Sangiovanni-Vincentelli, IEEE, 1987.

*A Loosely Coupled Parallel Algorithm for Standard Cell Placement*, W. Sun and C. Sechen, ACM 1994.

*Parallel Standard Cell Placement Algorithms with Quality Equivalent to Simulated Annealing*, J.S. Rose, W.M. Snelgrove and Z.G. Vranesic, IEEE Transactions on Computer-Aided Design, vol. 7, No. 3, Mar. 1988.

*Performance of a Parallel Algorithm for Standard Cell Placement on the Intel Hypercube*, M. Jones and P. Banerjee, 24th ACM/IEEE Design Automation Conf., 1987, Paper 42.3.

*A Parallel Simulated Annealing Algorithm for the Placement of Macro–Cells*, A. Casotto, F. Romeo and A. Sangiovanni-Vincentelli, Dept. Elect. Eng. & Computer Science, U.C.B.

(List continued on next page.)

*Primary Examiner*—Jacques H. Louis-Jacques
*Assistant Examiner*—Thai Phan
*Attorney, Agent, or Firm*—Oppenheimer Wolff & Donnelly

[57] ABSTRACT

A cell placement for an integrated circuit chip is divided into two "chessboard" patterns or "jiggles". Each pattern resembles a chessboard in that it consists of alternating regions of different types or "colors" such that no region of a given color has an edge common with another region of the same color. The jiggles are offset relative to each other such that the regions of one jiggle partially overlap at least two regions of the other jiggle. Simulated annealing is performed sequentially for each color of each jiggle. During each operation, a plurality of parallel processors operate on the regions simultaneously using a previous copy of the entire chip, with one processor being assigned to one or more regions. At the end of each operation, the copy of the chip is updated. The chessboard patterns eliminate unproductive cell moves resulting from adjacent regions having a common edge. The jiggles enable cells to move to their optimal positions from their initial region to any other region on the chip. The regions can have rectangular, triangular or hexagonal shapes. An initial temperature for the actual simulated annealing operation is determined by performing simulated annealing without cell swaps with different temperature, and selecting the temperature at which a cost function such as total wirelength does not significantly change.

28 Claims, 20 Drawing Sheets

OTHER PUBLICATIONS

*ProperPlace: A Portable Parallel Algorithm for Standard Cell Placement*, S. Kim, J.A. Chandy, S. Parkes, B. Ramkumar, P. Banerjee, IEEE 1994.

*A Cell–Replicating Approach to Mincut–Based Circuit Partitioning*, C. Kring and A.R. Newton, IEEE, 1991.

Siarry et al., "Thermodynamic Optimization of Block Placement," IEEE, 1987, pp. 211–221.

Rose et al., "Temperature Measurement and Equilibrium Dynamics of Simulated Annealing placements," IEEE, 1990, pp. 253–259.

Hong et al., "Parallel Error Tolerance Scheme Based on the Hill Climbing Nature of Simulated Annealing," IEEE, 1992, pp. 685–688.

PHYSICAL DESIGN AUTOMATION SYSTEM AND PROCESS FOR DESIGNING INTEGRATED CIRCUIT CHIP USING SIMULATED ANNEALING WITH "CHESSBOARD AND JIGGLE" OPTIMIZATION

BACKGROUND OF THE INVENTION

1. Field of the Invention

The present invention generally relates to the art of microelectronic integrated circuits, and more specifically to a physical design automation system and process for designing integrated circuit chips using simulated annealing with "chessboard" and "sieve" optimization.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including genetic algorithms such as simulated evolution, force directed placement or simulated annealing, and comparing the resulting placements using a cost criteria.

A major drawback of these prior art methodologies as implemented using a conventional digital computer is their sequential nature. Since integrated circuits commonly include hundreds of thousands of cells that must be placed and routed, computer run times are unacceptably long for practical commercial applications.

Basic simulated annealing per se is well known in the art and has been successfully used in many phases of VLSI physical design such as circuit partitioning. Simulated annealing is used in placement as an iterative improvement algorithm. Given a placement configuration, a change to that configuration is made by moving a component or interchanging locations of two components. Such interchange can be alternatively expressed as transposition or swapping.

In the case of a simple pairwise interchange algorithm, it is possible that a configuration achieved has a cost higher than that of the optimum, but no interchange can cause further cost reduction. In such a situation, the algorithm is trapped at a local optimum and cannot proceed further. This happens quite often when the algorithm is used in practical applications. Simulated annealing helps to avoid getting stuck at a local optima by occasionally accepting moves or swaps that result in a cost increase.

In simulated annealing, all moves that result in a decrease in cost are accepted. Moves that result in an increase in cost are accepted with a probability that decreases over the iterations. The analogy to the actual annealing process is heightened with the use of a parameter called temperature T. This parameter controls the probability of accepting moves that result in increased cost.

More of such moves are accepted at higher values of temperature than at lower values. The algorithm starts with a very high value of temperature that gradually decreases so that moves that increase cost have a progressively lower probability of being accepted. Finally, the temperature reduces to a very low value which requires that only moves that reduce costs are to be accepted. In this way, the algorithm converges to an optimal or near optimal configuration.

In each stage, the placement is shuffled randomly to get a new placement. This random shuffling could be achieved by transposing a cell to a random location, a transposition of two cells, or any other move that can change the wire length or other cost criteria. After the shuffle, the change in cost is evaluated. If there is a decrease in cost, the configuration is accepted. Otherwise, the new configuration is accepted with a probability that depends on the temperature.

The temperature is then lowered using some function which, for example, could be exponential in nature. The process is stopped when the temperature is dropped to a certain level. A number of variations and improvements on the basic simulated annealing algorithm have been developed. An example is described in an article entitled "Timberwolf 3.2: A New Standard Cell Placement and Global Routing Package" by Carl Sechen, et al., IEEE 23rd Designed Automation Conference paper 26.1, pages 432 to 439.

A problem which has existed in the prior art as applied to simulated annealing is determination of an initial temperature. If the initial temperature is too high, the solution may diverge such that the placement is made worse rather than improved. If the initial temperature is too low, the run time will be excessive, and the solution may become trapped at a local optima.

Attempts have been made to overcome the limitations of prior art algorithms such as simulated annealing by dividing a chip into a number of regions, and simultaneously optimizing the placements inside the regions using respective parallel processors. Each processor has its own copy of the chip, and works only in the region(s) to which it is assigned. There is another, master copy of the chip which is updated periodically to reflect the changes in the individual regions. An example of this methodology is found in an article entitled "A Loosely Coupled Parallel Algorithm for Standard Cell Placement, by W. Sun and C. Sechen, Proceedings of the 1987 IEEE Conference on CAD, pp. 478 to 481.

As illustrated in FIG. 3, the Sun and Sechen methodology divides a placement 200 into strips or regions R1 to R6, and performs localized simulated annealing in the regions using respective parallel processors.

A major problem inherent in this approach is that, during one period between two consecutive updates of the master copy, a processor working in a given region does not see the changes being made in the other regions by the other processors, and bases all placement change decisions on the cell positions in the previous master copy.

The drawbacks of the prior art are illustrated in FIGS. 4a and 4b. A net N interconnects cells C1 and C2 which are located in regions R1 and R2 of an integrated circuit chip. A goal of the placement optimization is to minimize the total wirelength of the placement.

The processor working in the region R1 sees the cell C2 in the previous master copy of the chip, and moves the cell C1 toward the cell C2 in the direction of an arrow D1 to reduce the length of the net N. Similarly, the processor working in the region R2 sees the cell C1 in the previous master copy of the chip, and moves the cell C2 toward the cell C1 in the direction of an arrow D2 to reduce the length of the net N.

The result is illustrated in FIG. 4b. The positions of the cells C1 and C2 have been essentially reversed with relation to each other, and the length of the net N is substantially unchanged.

The methodology of FIG. 3 is further disadvantageous due to the large number of "crossover nets" which exist in practical applications. As viewed in the drawing, crossover nets 202 are those that interconnect cells in two or more of the regions R1 to R6.

If an attempt to improve the method using more processors is made, then the number of regions as well as the number of crossover nets also increase. This is detrimental to the convergence of the solution. The only way to solve this problem is to increase the number of interprocessor communications. However, this dramatically increases the run time, and may not even achieve the quality of the basic sequential algorithm.

Another limitation of the prior art is that with optimization being performed locally within a plurality of regions, a cell is not able to be moved from one region to another even though the optimal position for the cell is in a region far remote from the region in which it is initially located.

SUMMARY OF THE INVENTION

The present invention overcomes the drawbacks of the prior art by parallelizing the placement improvement operation such that changes in two regions of an integrated circuit chip do not produce an undesirable increase in the length of wiring interconnecting the regions, and allowing a cell to be moved from one region to any other region on the chip.

In accordance with the present invention, a cell placement for an integrated circuit chip is divided into two "chessboard" patterns or "jiggles". Each pattern resembles a chessboard in that it consists of alternating regions of different types or "colors", such that no region of a given color has an edge common with another region of the same color.

The jiggles are offset relative to each other such that the regions of one jiggle partially overlap at least two regions of the other jiggle. Simulated annealing is performed sequentially for each color of each jiggle.

During each operation, a plurality of parallel processors operate on the regions simultaneously using a previous copy of the entire chip, with one processor being assigned to one or more regions. At the end of each operation, the copy of the chip is updated.

The chessboard patterns eliminate unproductive cell moves resulting from adjacent regions having a common edge. The jiggles enable cells to move to their optimal positions from their initial region to any other region on the chip. The regions can have rectangular, triangular or hexagonal shapes.

An initial temperature for the actual simulated annealing operation is determined by performing simulated annealing without cell swaps with different temperature, and selecting the temperature at which a cost function such as total wirelength does not significantly change.

A major advantage of the present invention is that it is highly scalable, and can use larger numbers of processors for larger integrated circuit chip designs.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
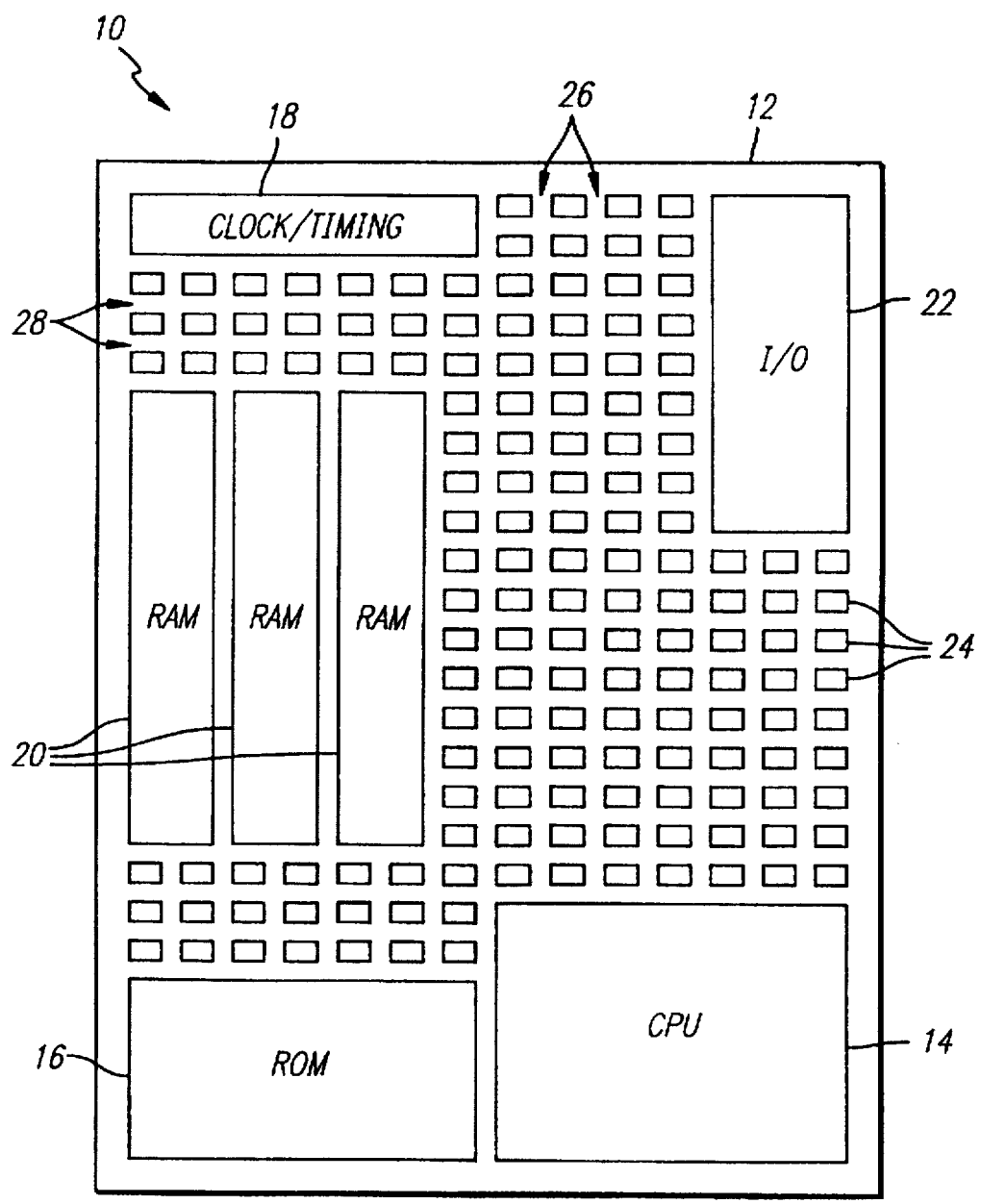
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24

Figure 2:
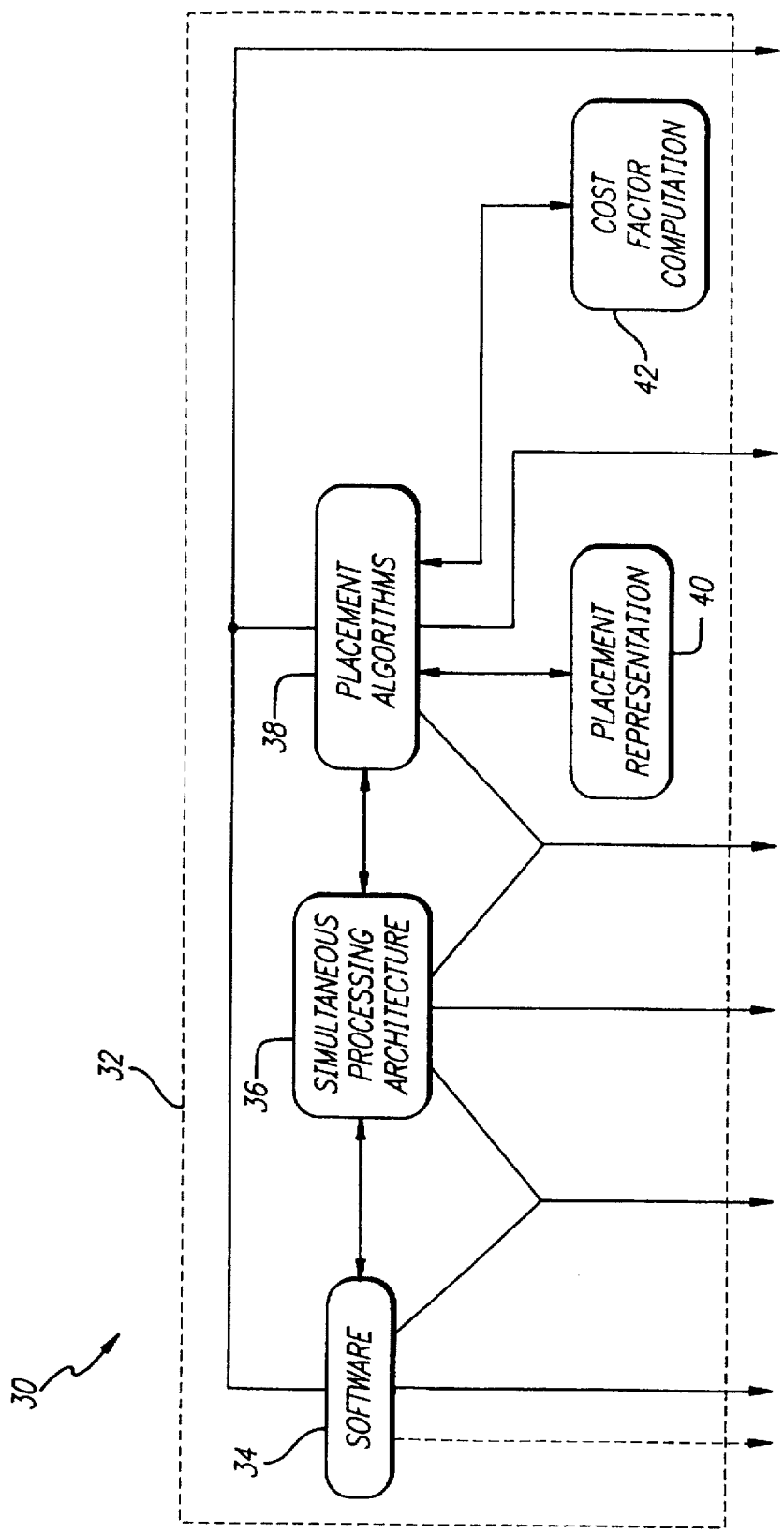
FIG. 2 is a diagram illustrating the main blocks of a multi-processing optimization system for practicing a method of the present invention.
Figure 3:
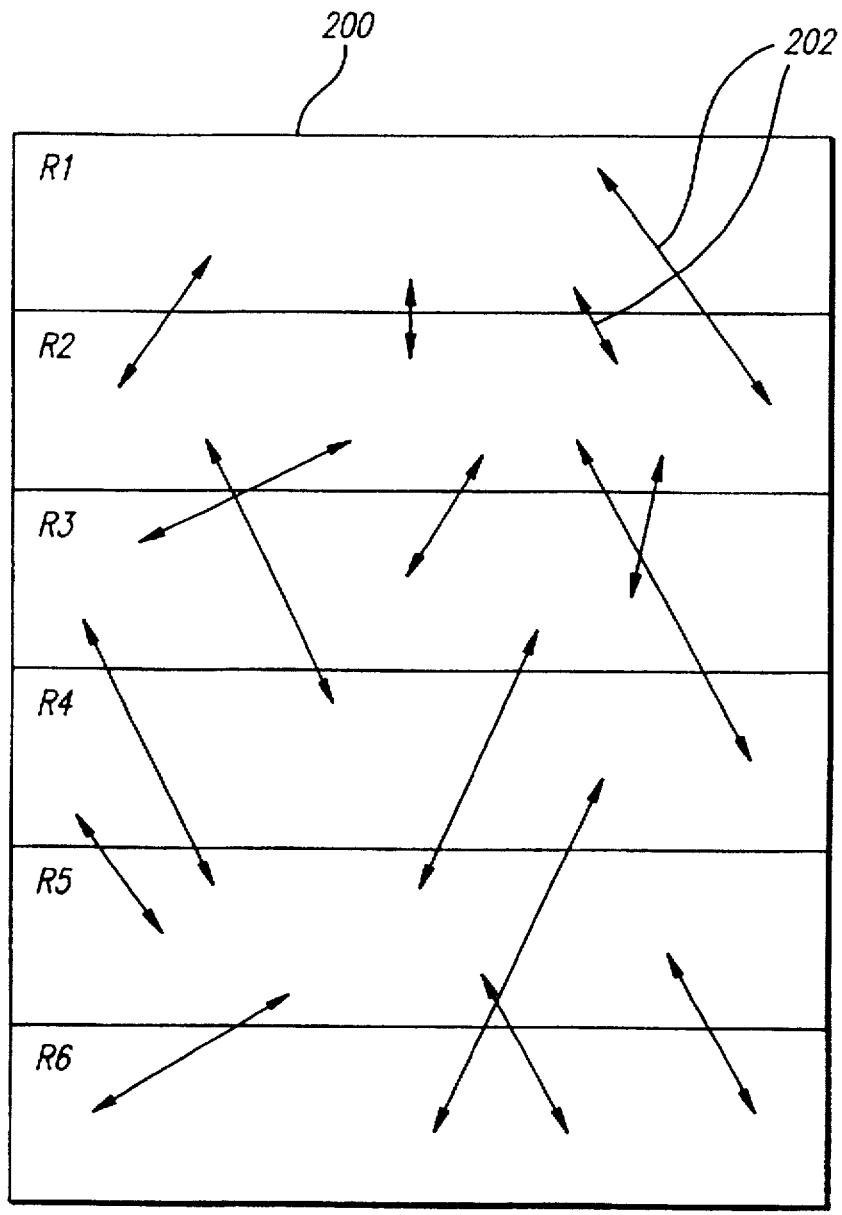
FIG. 3 is a diagram illustrating a prior art optimization method.

FIG. 2 illustrates an integrated circuit physical design automation system 30 for producing an optimized placement of the cells 24 such as illustrated in FIG. 1 in accordance with a method of the present invention.

As will become evident from further description, system 30 is embodied as a programmed digital computer which generally comprises a processing means, memory means, and operating program which is stored in the memory means and executed by the processing means. The processing means preferably comprises a plurality of parallel processors for operating on a large number of areas of an integrated circuit cell placement concurrently.

The system 30 receives inputs for a user specified integrated circuit design including a netlist, a library of standardized microelectronic elements or cells and functional units including combinations of cells, and a set of rules that define the objectives of the design.

The architecture 36 collectively implements the required functionality of the present process by assigning different parallel processors to perform operations serially and/or concurrently, and combining the results thereof.

More specifically, the architecture 36 decomposes these functions into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or placement algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

Figure 5A:
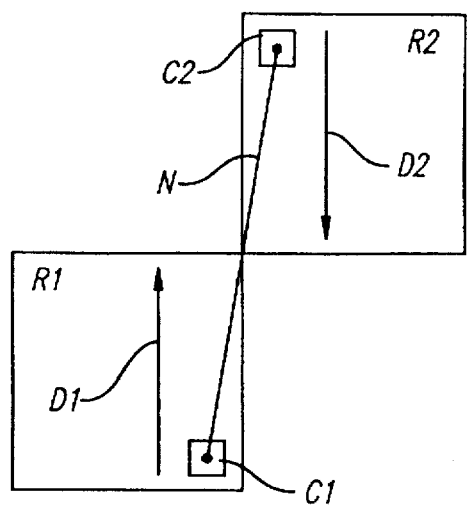
FIGS. 5a and 5b are similar to FIGS. 4a and 4b, illustrating how the prior art problem is solved in accordance with the present invention.
Figure 5B:
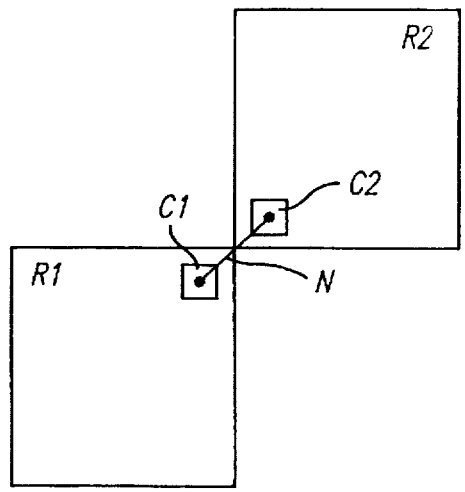

A fundamental principle of the present invention is illustrated in FIGS. 5a and 5b.

In accordance with the invention, an integrated circuit chip is divided into a plurality of rectangular or square regions of different types or "colors". Shown in the drawings are a region R1 and a region R2 which are diagonally offset (translated) relative to each other, and have a common vertex V.

Two cells C1 and C2 are located in the regions R1 and R2 respectively and are interconnected by a wiring net N. During a placement improvement operation such as simulated annealing, a processor of the architecture 36 working in the region R1 sees the cell C2 in the region R2, and moves the cell C1 in the direction of an arrow D1 toward the cell C2 to reduce the length of the net N. Similarly, a processor working in the region R2 sees the cell C1 in the region R1, and moves the cell C2 in the direction of an arrow D2 toward the cell C1 to reduce the length of the net N.

Figure 4A:
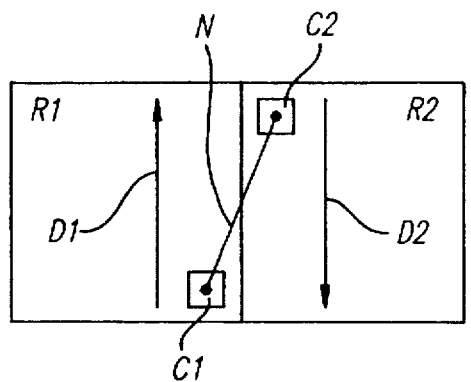
FIGS. 4a and 4b are diagrams illustrating a problem which has persisted in the prior art.
Figure 4B:
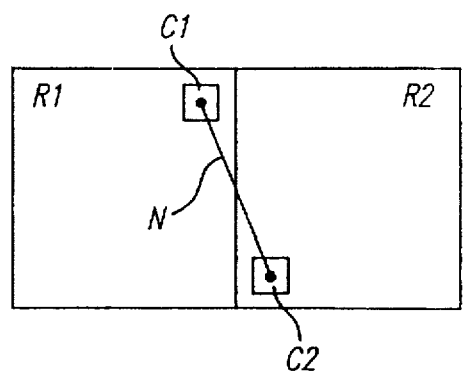

The result is illustrated in FIG. 5b. It will be seen that the length of the net N has been substantially reduced. The improvement is especially evident from a comparison of FIG. 5b with FIG. 4b.

The improvement of the invention is accomplished by defining the regions R1 and R2 such that they do not have a common side. Although an embodiment of the invention using rectangular (square) regions is shown in FIGS. 5a and 5b, it will be understood that the invention is not so limited, and that the regions can have other shapes such as triangular and hexagonal as will become apparent from further description.

Figure 6:
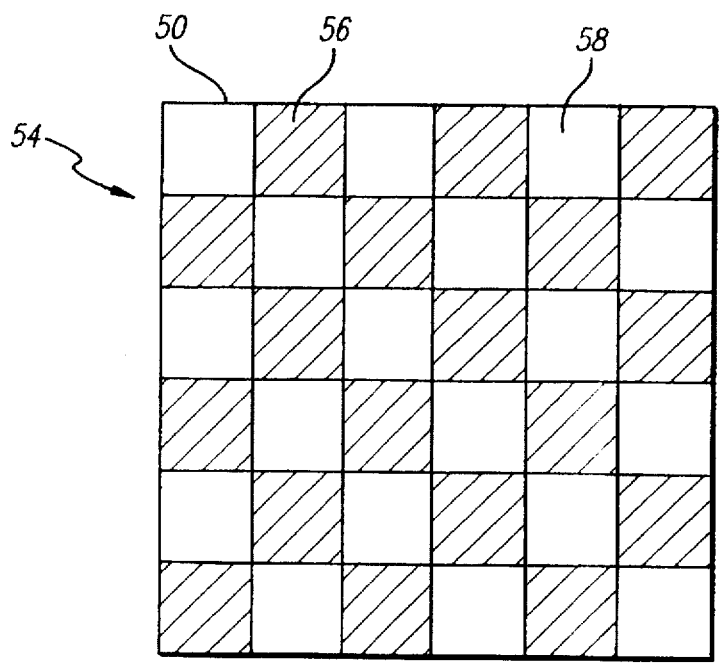
FIGS. 6 and 7 are diagrams illustrating two "jiggles" having rectangular "chessboard" patterns in accordance with the present invention.
Figure 7:
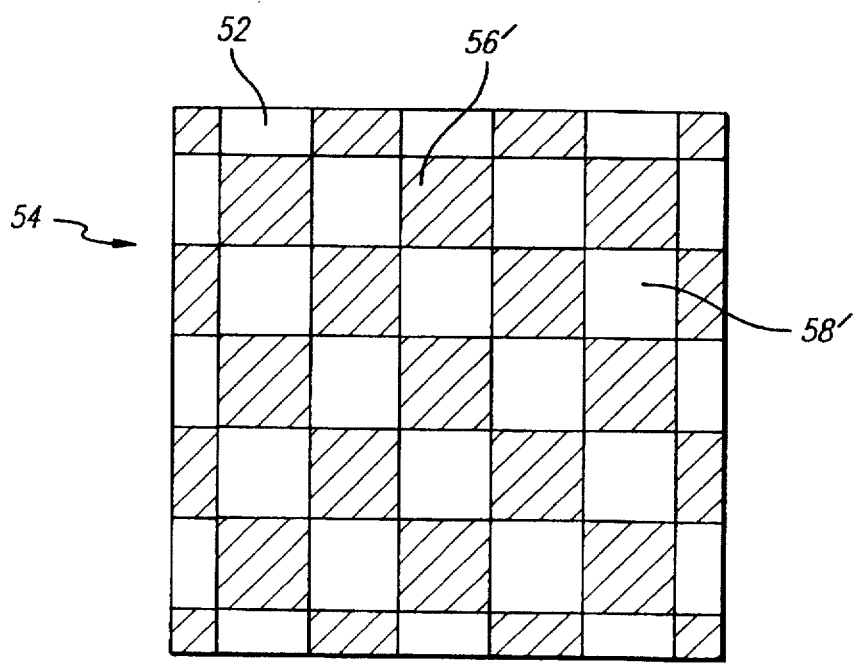

FIGS. 6 and 7 illustrate two "jiggles" 50 and 52 having "chessboard" patterns in accordance with the present invention. In FIG. 6, the entire area of an integrated circuit chip 54 is divided into a plurality of regions of two different types or "colors". The different colored regions comprise "black" regions 56 and "white" regions 58 which spatially alternate with each other such that no region of one color has an edge common with another region of the same color. The pattern of the jiggle 50 is identical to a chessboard (board used for playing the game "chess").

The jiggle 52 is similar to the jiggle 50, except that black and white regions 56' and 58' of the jiggle 52 are offset (translated) from the regions 56 and 58 of the jiggle 50. It will be noted that regions at the periphery of the jiggle 52 are half as large as those in the interior of the jiggle. This does not constitute a problem, since the jiggles 50 and 52 are considered as infinite meshes in accordance with the present invention.

Figure 8:
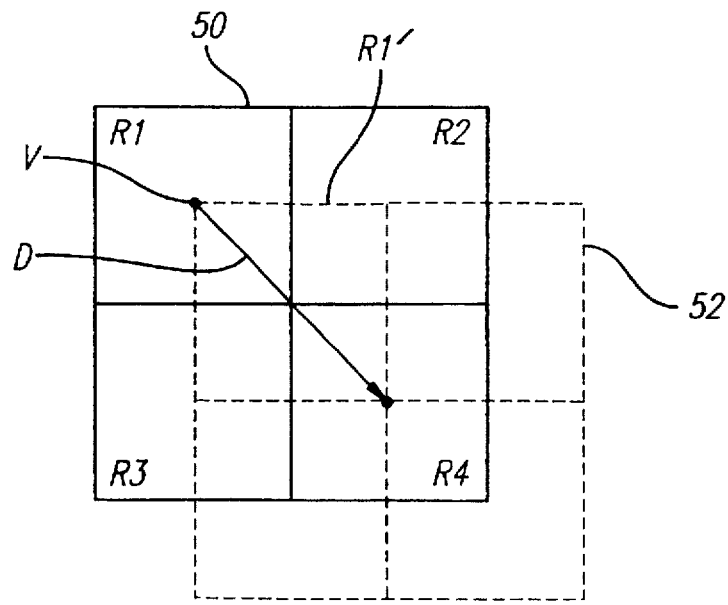
FIG. 8 is a diagram illustrating how the jiggle of FIG. 7 is translated from the jiggle of FIG. 6.

The relationship between the jiggles 50 and 52 is illustrated in FIG. 8. The jiggle 52 is translated diagonally (rightwardly and downwardly) relative to the jiggle 50 by one-half pitch (one-half the length of one side of a region) in the direction of an arrow D. The result of the translation is that the upper left vertex of a region R1' of the jiggle 52 is coincident with the center of a region R1 of the jiggle 50 as indicated at V.

Figure 9:
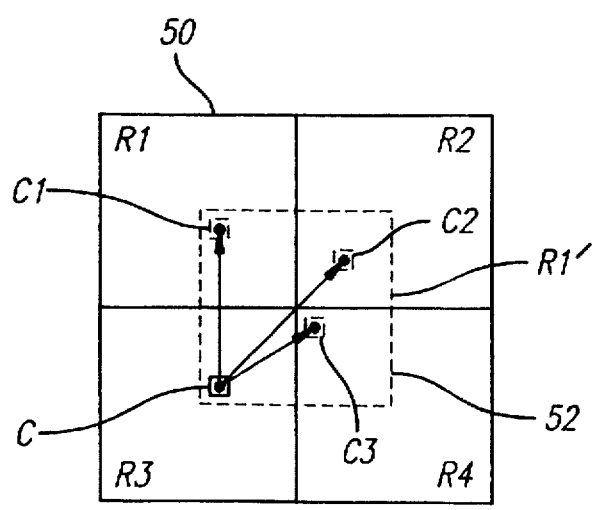
FIG. 9 is a diagram illustrating how a cell in one region can be moved to any of three adjacent regions.

As illustrated in FIG. 9, the region R1' of the jiggle 52 partially overlaps regions R1, R2, R3 and R4 of the jiggle 50. As a result, when a placement improvement operation is being locally performed in the region R1', any cell in the region R1' is able to move to any position within the region R1'. This enables a cell, for as illustrated at C, to move from an initial position in the region R3 of the jiggle 50 to exemplary locations C1, C2 and C3.

Although all of the locations C, C1, C2 and C3 are within the region R1' of the jiggle 52, they are in different regions R3, R1, R2 and R4 respectively in the jiggle 50. In this manner, a cell is able to move from one original region to another, and in fact move to any region on the entire chip.

This overcomes the limitation of the prior art in that, where placement improvement operations are being performed locally within regions, cells are not able to move from one region to another, even if their optimal locations are in regions far remote from their original regions.

Figure 10:
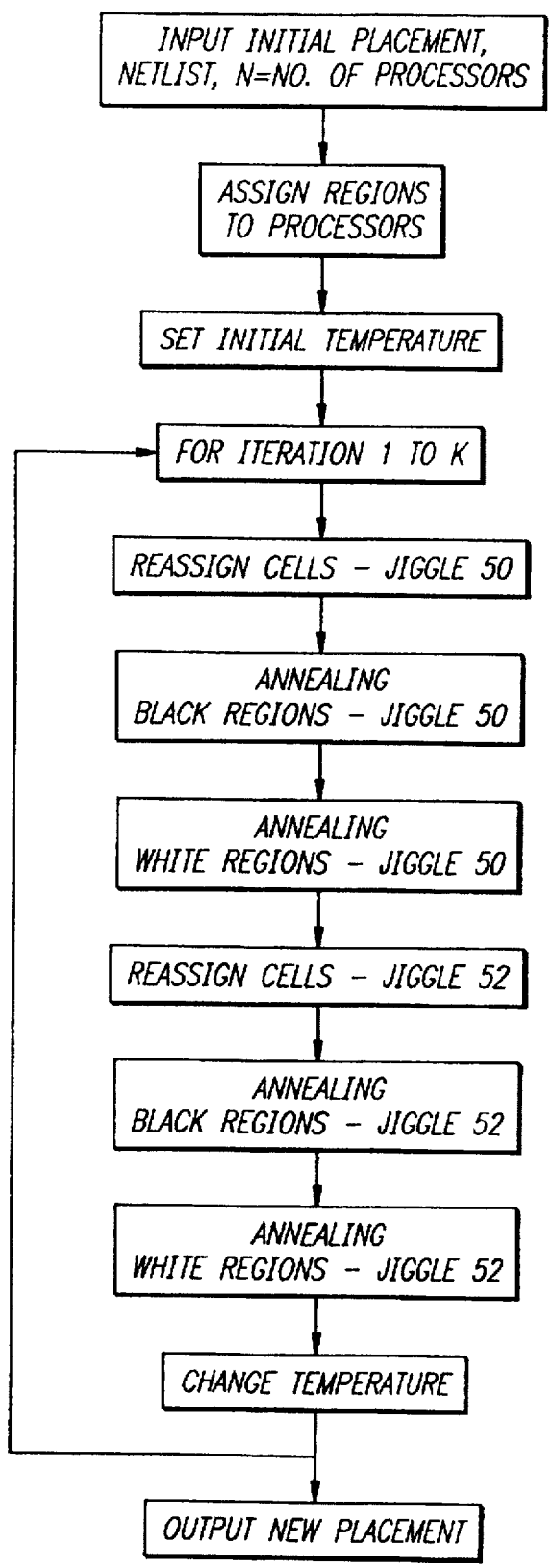
FIG. 10 is a flowchart illustrating a process according to the present invention.

A process embodying the present invention is illustrated in the form of a flowchart in FIG. 10. The first step is to input all required parameters, including an initial cell placement, interconnect netlist, and the number of processors that the architecture 36 has available for performing placement improvement or optimization operations.

Next, the chip is divided into the jiggles 50 and 52 as illustrated in FIGS. 5 and 6, and the processors are assigned to the regions. One processor can be assigned to one or more regions, with the load preferably balanced between the processors.

The processors are assigned such that each processor works on approximately the same region "capacity". The capacity can be defined in several ways, and is essentially based on the total number or area of cells in the regions to which a particular processor is assigned. It will be noted that a chip can include large macrocells or other areas which are not available for cell placement, and that these areas are not considered in assigning regions to processors.

If the cells can have different sizes and shapes, the capacity can be represented by the sum of the areas of the cells. If the cells have the same width and can have different heights, the capacity can be represented by the total heights of the cells. If the cells are all identical, the capacity can be represented by the numbers of cells themselves.

If the cells are approximately evenly distributed over the chip, which usually happens, the processors can be assigned to pluralities of regions without taking into account the actual numbers or total areas of cells in each region, but the areas of the regions themselves.

The number of regions should be big enough to allow the balanced distribution of regions' capacities to processors. On the other hand, if the regions are too small, then the number of interprocessor communications has to be increased, which leads to longer run time. In a typical design, if the number of processors is N, a jiggle will be defined as consisting of M×M square regions such that $M^2=4N$.

After the regions have been assigned to the processors, an initial temperature for simulated annealing is determined in a manner which will be described in detail below. Then, an iteration loop is performed K times, or alternatively until another predetermined end criterion is reached. For example, the end criterion can be such that the total wire-length of the placement is reduced below a predetermined value.

During each iteration of the loop, four simulated annealing operations are performed on the colors of the jiggles respectively. The details of the simulated annealing operations are not the particular subject matter of the invention, and may correspond to those presented in the above referenced Timberwolf 3.2 article.

The first operation is to reassign cells to the jiggle 50, and perform simulated annealing on the cells in the black regions 56 of the jiggle 50. The simulated annealing operations are performed locally in the regions 56 using one processor assigned to each region, or one processor assigned to a plurality of regions as described above.

Then, simulated annealing is similarly performed in the white regions of the jiggle 50, after which the cells are reassigned to the regions of the jiggle 52.

The procedure is then repeated for the black and white regions of the jiggle 52. Upon completion of performing simulated annealing on four sets of cells (black and white regions of the two jiggles), a cost function such as total wirelength of the placement is computed.

The temperature for the simulated annealing operation is changed at the end of each iteration (1 to K) based on the acceptance rate (number of accepted swaps divided by the total number of attempted swaps) during the iteration. A single processor collects this information from the processors which performed the simulated annealing operations. If the acceptance rate is higher than a certain predetermined value (for example 25%), the temperature is reduced. Conversely, if the acceptance rate is smaller, the temperature is increased.

The process is terminated after K iterations, or alternatively when the cost function has been reduced below a predetermined value.

Figure 11:
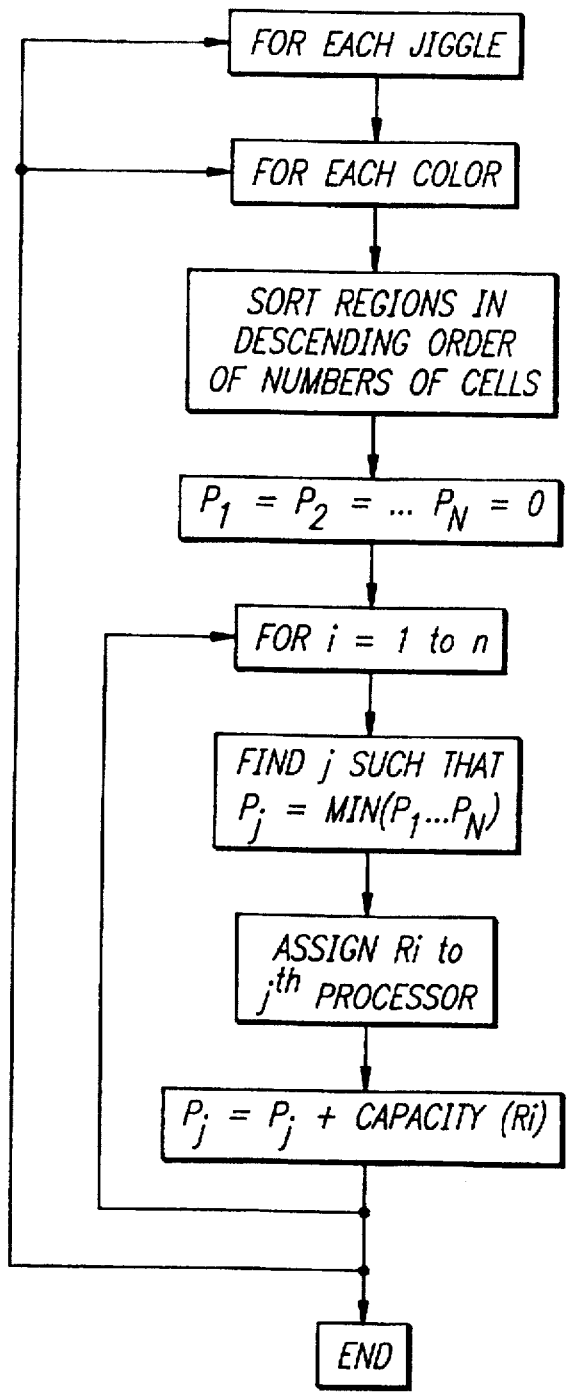
FIG. 11 is a flowchart illustrating how regions are assigned to processors.

FIG. 11 illustrates how cells are assigned to regions in accordance with a preferred embodiment of the invention. For each jiggle and each color, the regions are sorted in descending order of numbers of cells. There are n regions which are designated as $R_i$, with i being the index for the regions. The capacity of the region $R_i$ is designated as capacity $(R_i)$.

There are N processors. The numbers of cells assigned to the processors are designated as $p_j$, with j being the index for the processors.

Next, the numbers of cells assigned to each processor are initialized to zero. Then, each region (for i=1 to n) is assigned to the processor ($p_j$=MIN ($p_i$ ... $p_N$) having the smallest number of assigned cells). The number of cells in the processor to which the region was assigned is updated to include the number of cells in the region ($p_j=p_j$+capacity $(R_i)$). The process is repeated until all regions have been assigned to processors.

Figure 12:
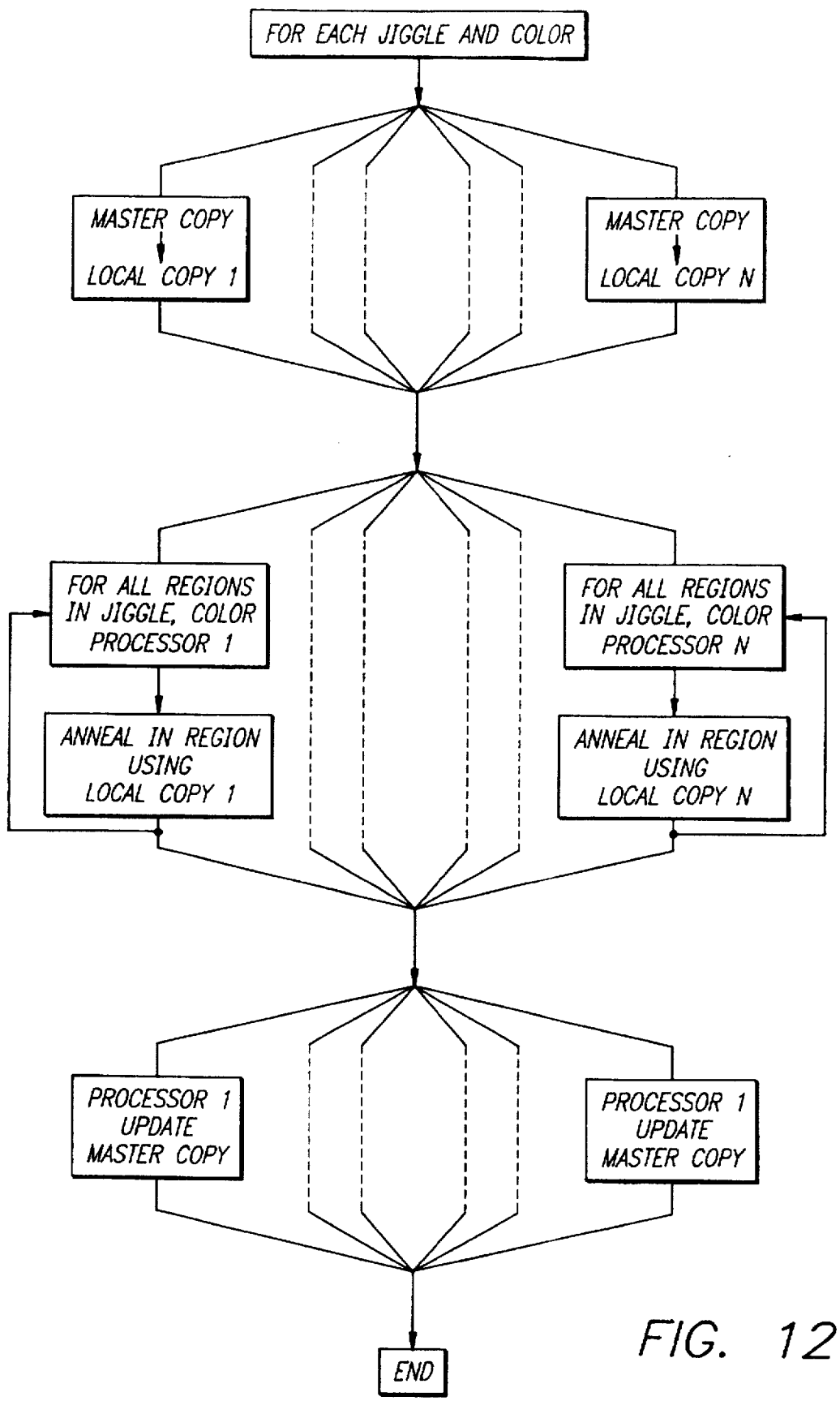
FIG. 12 is a flowchart illustrating how local and master copies are updated in accordance with the present method.

Prior to performing the operations illustrated in FIG. 10, the architecture 36 generates a master copy of the entire cell placement on the chip, and distributes individual or local copies to all of the N processors. This is illustrated in the flowchart of FIG. 12. Thus, each processor knows the position of every cell on the chip, and is able to perform local operations based on the master plan.

After the simulated annealing operation for the current jiggle and color is performed, the architecture 36 generates an updated master copy based on the local changes in the regions, and distributes updated individual copies to all of the processors. Processors simultaneously update the master copy according to changes they performed locally.

In this manner, unproductive cell moves are eliminated as described with reference to FIGS. 5a and 5b, and cells are able to move from an initial region to any other region on the chip as described with reference to FIG. 9. The result is that global optimization is accomplished using local optimizations which are performed simultaneously using parallel processors. Thus, the computation run time is greatly reduced, and the process is advantageous for commercial application.

The relative orientation of the jiggles 50 and 52 enables a cell in one region to move to locations in three adjacent regions. Thus, optimization can be accomplished using only two jiggles. However, the invention is not so limited, and different numbers of jiggles with different orientations can be used.

Figure 13:
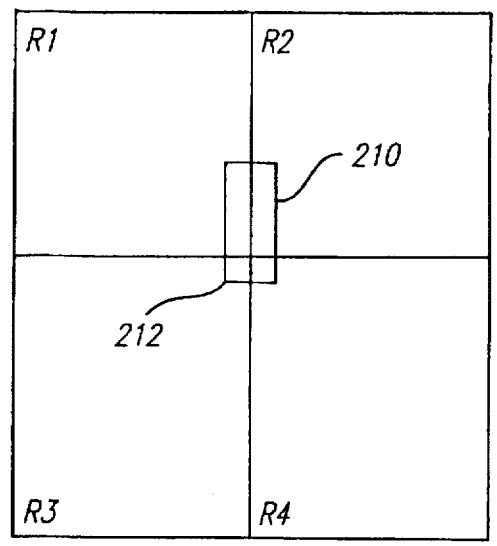
FIG. 13 is a diagram illustrating how a cell is assigned to a region.

FIG. 13 illustrates how a cell 210 is assigned to a region if, after performing a simulated annealing operation, the cell 210 overlaps two or more regions R1 to R4. As viewed in the figure, the cell 210 partially overlaps all of the regions. In such a case, a criterion is predetermined to select a region for assignment of the cell. For example, the cell can be assigned to the region in which its lower left corner 212 lies. In the illustrated example, the cell 210 will be assigned to the region R3.

As discussed above, it is important to determine an effective initial temperature for the simulated annealing operations. If the initial temperature is too high, the solution may diverge such that the placement is made worse rather than improved. If the initial temperature is too low, the run time will be excessive, and the solution may be trapped at local optima.

The initial temperature as described with reference to FIG. 10 is determined as an "equilibrium" temperature at which the change in cost function is substantially zero. More specifically, the steps illustrated in FIG. 10 are performed once, with the exception that no cell moves or swaps are actually made. This means that the steps of reassigning the cells to the jiggles after performing the simulated annealing operations are omitted.

First, a trial temperature is set, and simulated annealing is performed for the colors and jiggles. Then, a cost function (total wirelength, etc.) for the placement which would result if the accepted swaps were made is computed. If the cost function is different from the cost function for the initial placement, a new temperature is set and the operation is repeated.

If the new cost function is higher than the original cost function, the temperature for the next iteration is reduced from the previous value, and vice-versa. This process is repeated until the cost function for the last iteration is substantially equal to the original cost function. The temperature which produces substantially no change in cost function is used as the initial temperature, and the subsequent steps of FIG. 10 are performed in a normal manner with the accepted swaps being made and the temperature progressively reduced as described, for example, in the Timberwolf 3.2 article.

Figure 14:
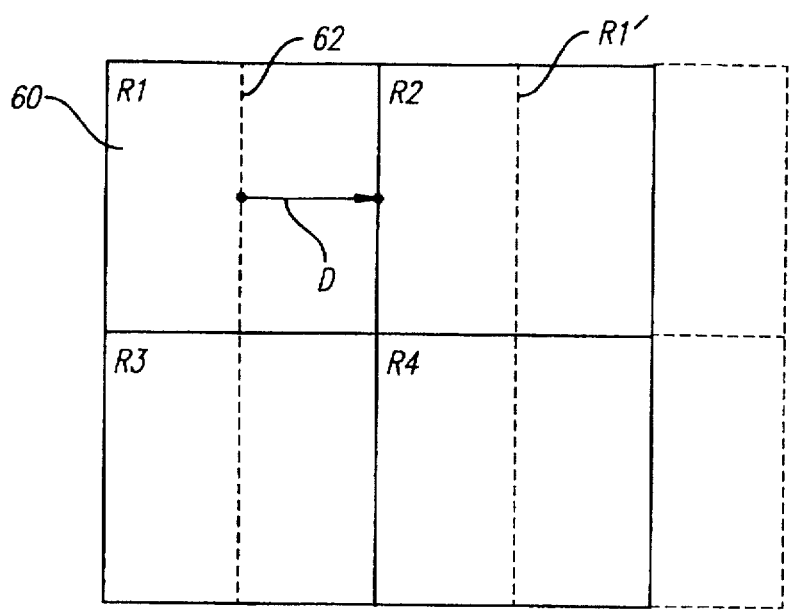
FIG. 14 is a diagram illustrating how the jiggle of FIG. 7 can be translated horizontally from the jiggle of FIG. 6.
Figure 15:
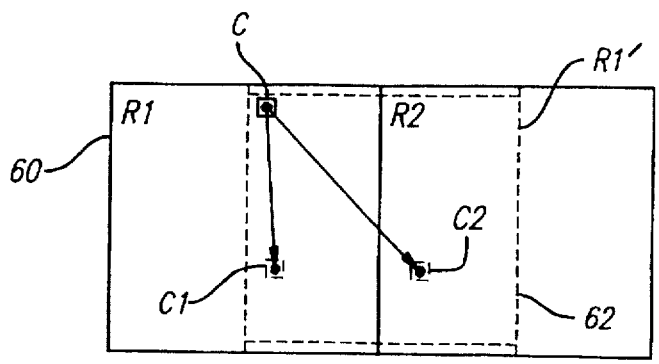
FIG. 15 is a diagram illustrating how a cell in one region can be moved to any of two adjacent regions.

FIGS. 14 to 17 illustrate an alternative embodiment of the present invention using three jiggles. As shown in FIG. 14, a second jiggle 62 (broken line) is translated horizontally from a first jiggle 60 (solid line) by one-half pitch, or one-half the length of a side of the regions of the jiggles 60 and 62 as indicated by an arrow D. In this manner, a cell C, for example, can move from an initial position as illustrated to anywhere in a region R1' which overlaps adjacent horizontal halves of regions R1 and R2 as shown in FIG. 15.

Although the cells can move between regions only in one direction, the amount of overlap is twice as much as in the embodiment of FIGS. 6 to 9.

Figure 16:
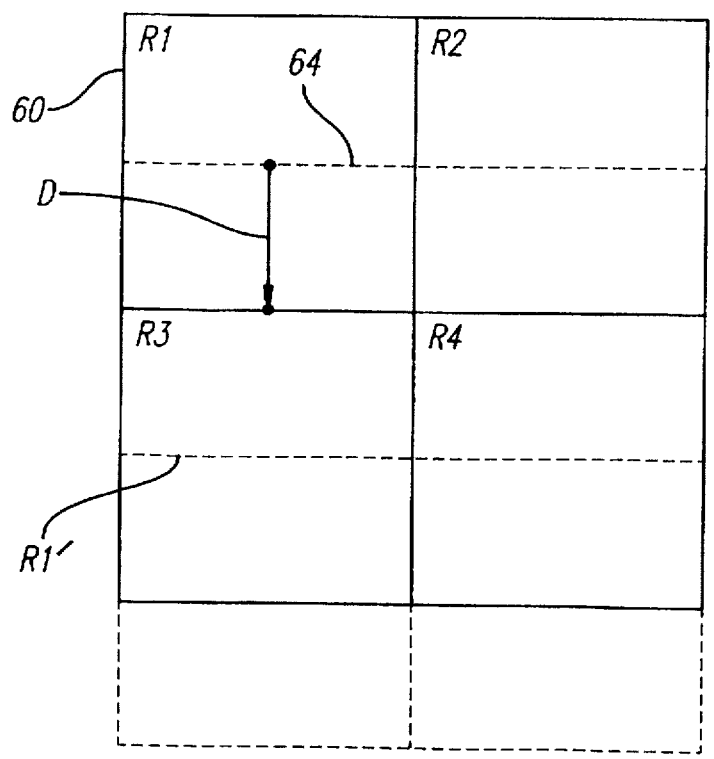
FIG. 16 is a diagram illustrating how the jiggle of FIG. 7 can be translated vertically from the jiggle of FIG. 6.
Figure 17:
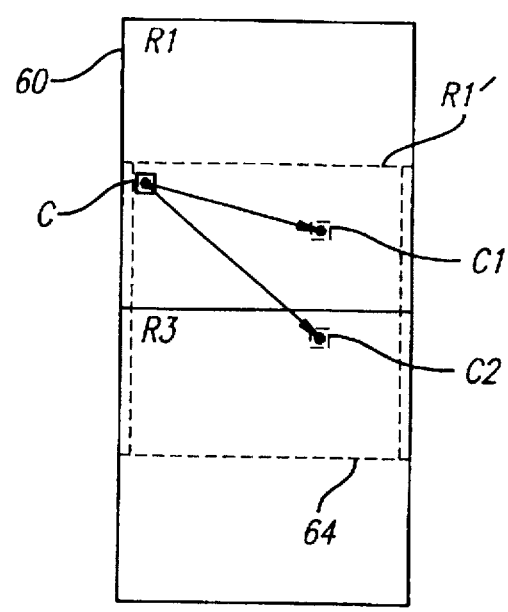
FIG. 17 is a diagram illustrating how a cell in one region can be moved to any of two adjacent regions.
Figure 18:
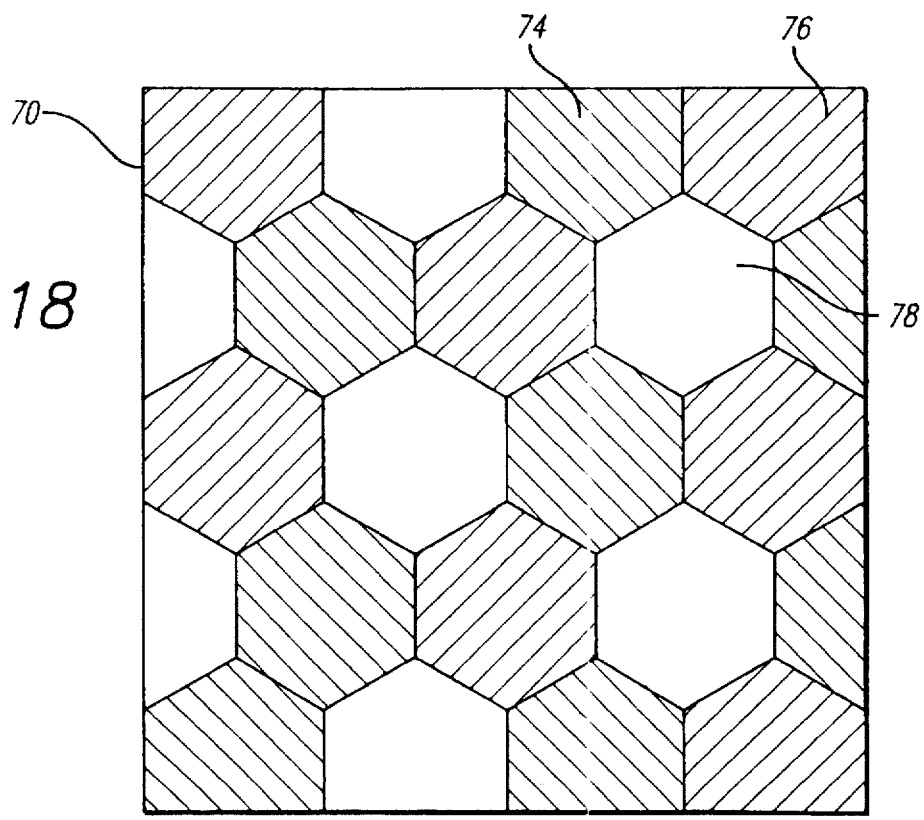
FIGS. 18 and 19 are diagrams illustrating two "jiggles" having hexagonal "chessboard" patterns in accordance with the present invention.

Cell movement in the vertical direction is enabled by a third jiggle 64 as illustrated in FIGS. 16 and 17. The jiggle 64 is translated from the jiggle 60 by one-half pitch in the vertical direction as indicated by an arrow D. In this manner, a cell C as shown in FIG. 17 can move to anywhere within adjacent overlapping vertical halves of the regions R1 and R3.

The present invention is not limited to a rectangular or square implementation as described above. For example, FIGS. 18 to 21 illustrate an embodiment of the invention using hexagonally shaped regions. More specifically, a jiggle 70 consists of hexagonal regions 74, 76 and 78 of different "colors". The regions 74 are represented by backwardly slanting hatching, the regions 76 are represented by forwardly slanting hatching, and the regions 78 are represented by no hatching.

As with the rectangular implementation, the regions 74, 76 and 78 spatially alternate with each other such that no region of a given color has an edge which is common with another region of the same color. Three regions are necessary due to the three directional symmetry of the hexagonal configuration.

Figure 19:
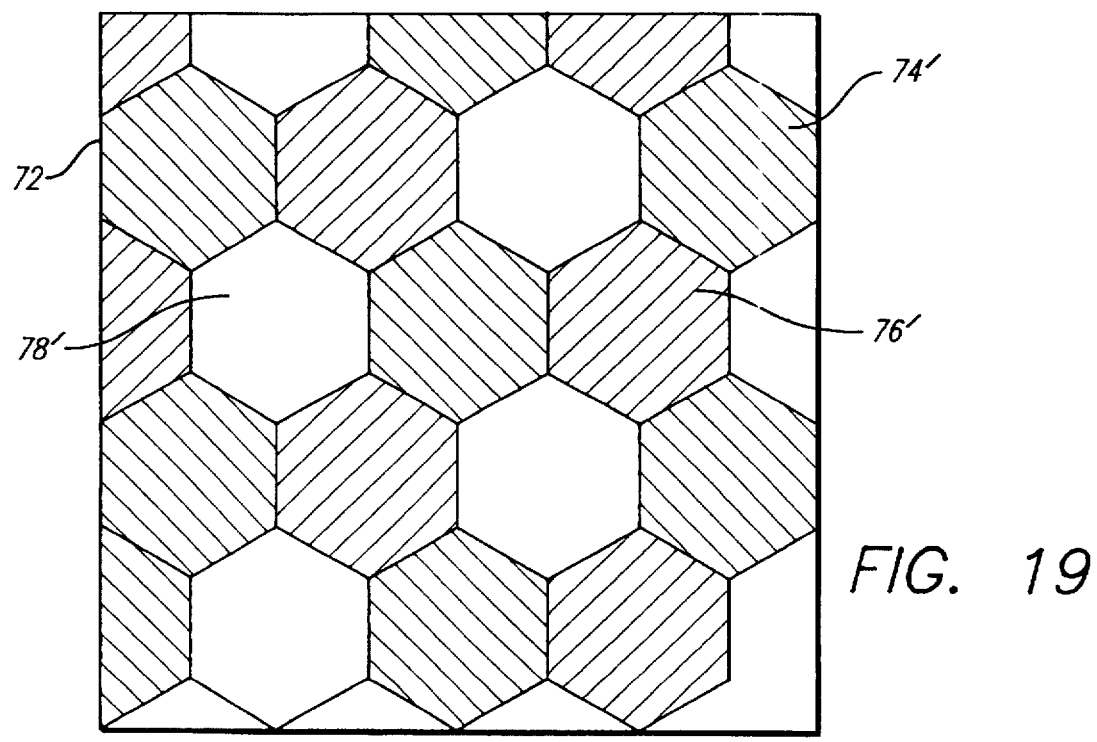
Figure 20:
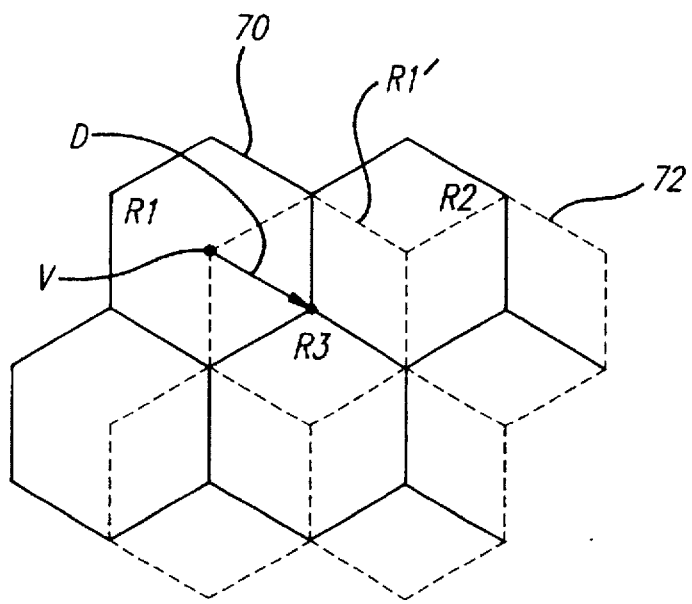
FIG. 20 is a diagram illustrating how the jiggle of FIG. 19 is translated from the jiggle of FIG. 18.

FIG. 19 illustrates a second jiggle 72 which is offset from the first jiggle 70 as illustrated in FIG. 20. More specifically, the jiggle 72 is translated in the direction of an arrow D such that a vertex of a region R1' of the jiggle 72 coincides with a center of a region R1 of the jiggle 70 as indicated at V. It will be noted that the arrow D extends parallel to the edges of the regions which slant rightwardly and downwardly as viewed in the drawing.

Figure 21:
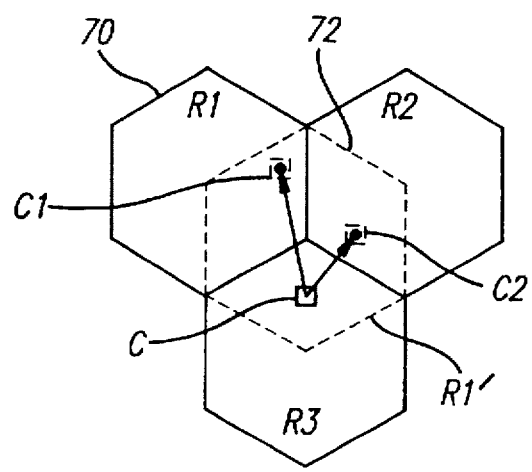
FIG. 21 is a diagram illustrating how a cell in one region can be moved to any of two adjacent regions.

The overlap provided by the jiggles 70 and 72 is illustrated in FIG. 21. A cell C, for example, is able to move from an initial location in the region R3 to locations C1 and C2 in the regions R1 and R2 respectively.

As with the rectangular embodiment of the invention, the hexagonal configuration can be implemented with more than two jiggles. FIGS. 22 to 27 illustrate an embodiment using four jiggles.

Figure 22:
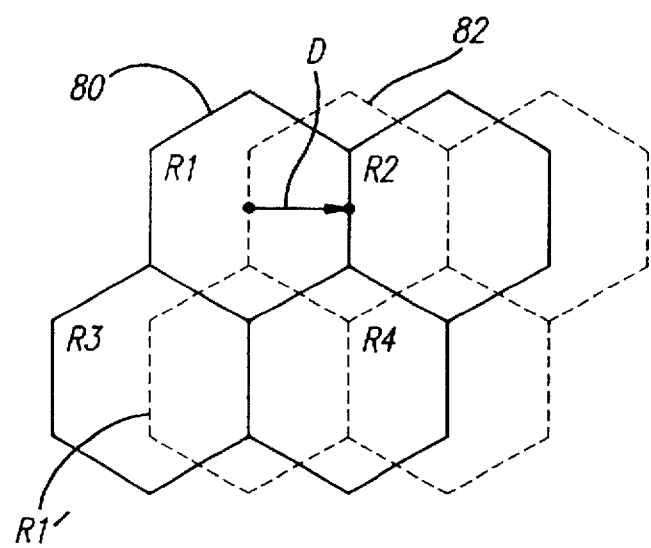
FIG. 22 is a diagram illustrating how the jiggle of FIG. 19 can be translated horizontally from the jiggle of FIG. 18.
Figure 23:
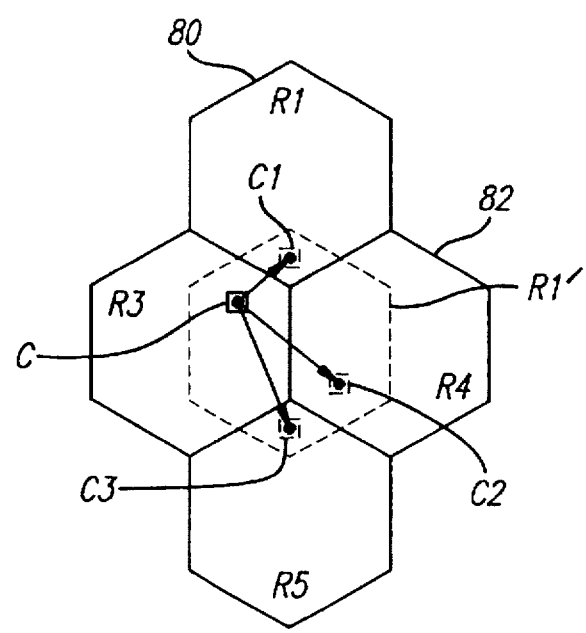
FIG. 23 is a diagram illustrating how a cell in one region can be moved to any of three adjacent regions.

In FIG. 22, a second jiggle 82 is translated horizontally from a first jiggle as indicated by an arrow D. The arrow D extends perpendicular to the vertical edges of the regions. The amount of translation is one-half pitch, or one-half the distance between two parallel edges of a region. As illustrated in FIG. 23, a region R1' of the jiggle 82 overlaps regions R1, R3, R4 and R5 of the jiggle 80 such that a cell C, for example, can move to locations C1, C2 and C3 in the regions R1, R4 and R5 respectively. It will be noted that the amount of horizontal overlap is greater than the amount of vertical overlap.

Figure 24:
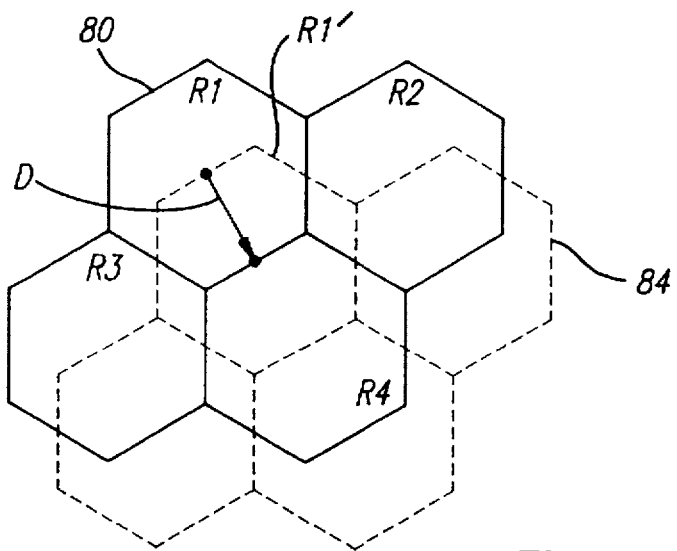
FIG. 24 is a diagram illustrating how the jiggle of FIG. 19 can be translated rightward and downward from the jiggle of FIG. 18.
Figure 25:
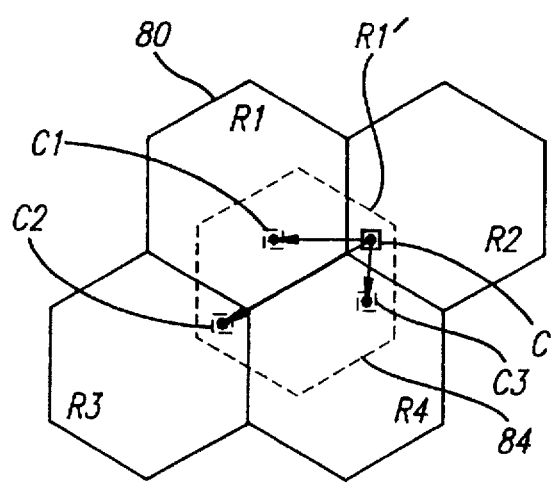
FIG. 25 is a diagram illustrating how a cell in one region can be moved to any of three adjacent regions.

FIG. 24 illustrates a third jiggle 84 which is translated downwardly and rightwardly from the jiggle 80 as indicated by an arrow D. The translation is perpendicular to the edges of the regions which slant rightwardly and upwardly. FIG. 25 illustrates the overlap, and possible movement of a cell C to locations C1, C2 and C3. The overlap asymmetry is similar to that of FIGS. 22 and 23, but rotated clockwise by 60°.

Figure 26:
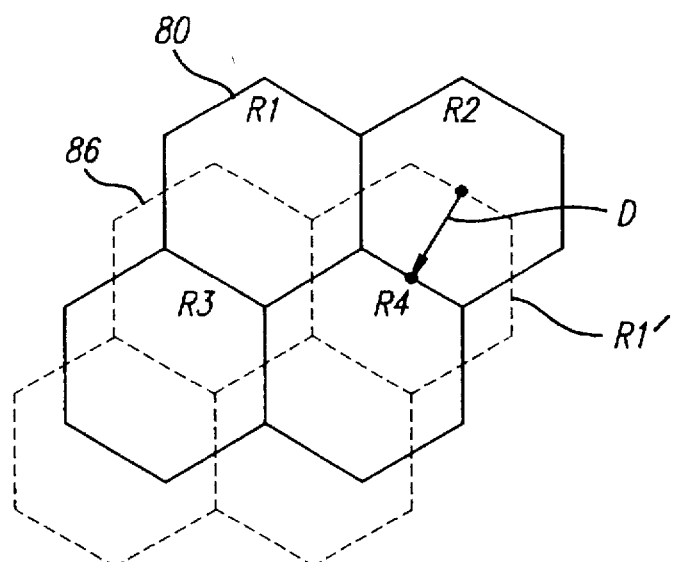
FIG. 26 is a diagram illustrating how the jiggle of FIG. 19 can be translated leftward and downward from the jiggle of FIG. 18.
Figure 27:
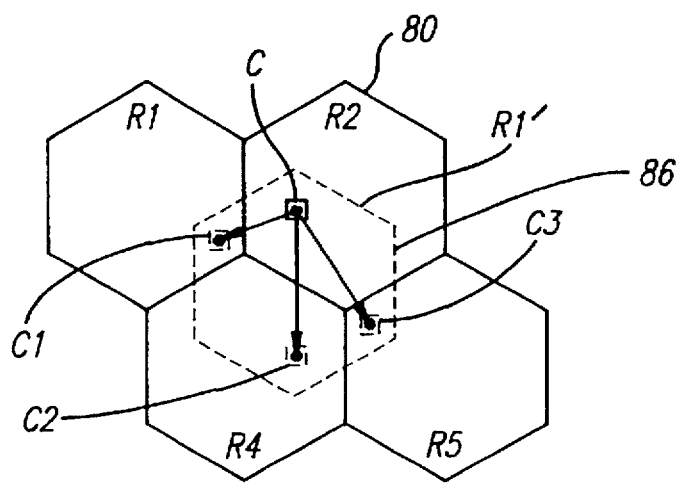
FIG. 27 is a diagram illustrating how a cell in one region can be moved to any of three adjacent regions.
Figure 28:
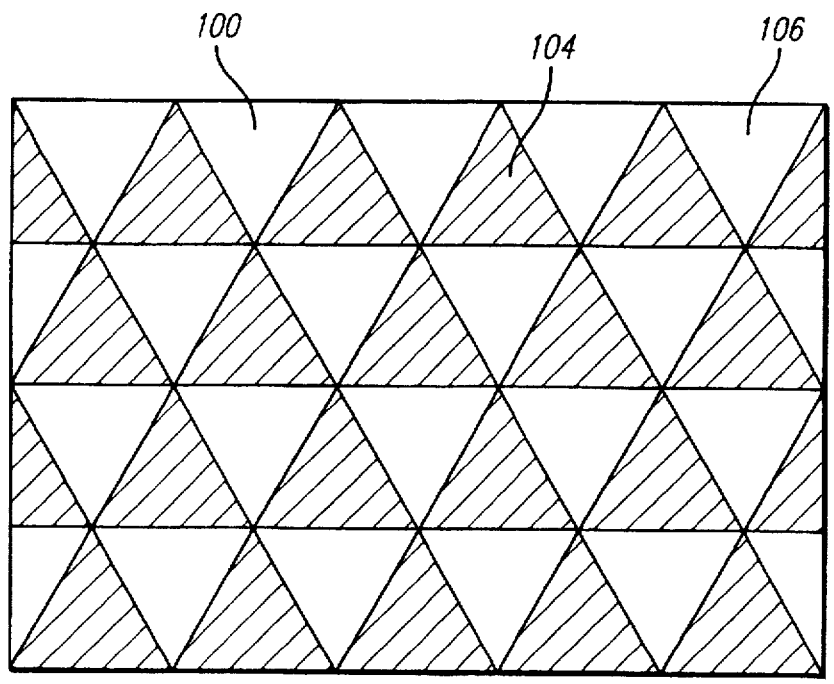
FIGS. 28 and 29 are diagrams illustrating two "jiggles" having triangular "chessboard" patterns in accordance with the present invention.

FIG. 26 illustrates a fourth jiggle 86 which is translated leftwardly and downwardly from the jiggle 80 as indicated by an arrow D. The translation is perpendicular to the edges of the regions which slant rightwardly and downwardly. FIG. 27 illustrates the overlap, and possible movement of a cell C to locations C1, C2 and C3. The overlap asymmetry is similar to that of FIGS. 22 and 23, but rotated clockwise by 210°.

FIGS. 28 to 31b illustrate an embodiment of the invention using equilateral triangle shaped regions. More specifically, a jiggle 100 consists of triangular regions 104 and 106 of different "colors".

As with the rectangular implementation, the regions 104 and 106 spatially alternate with each other such that no region of a given color has an edge which is common with another region of the same color.

Figure 29:
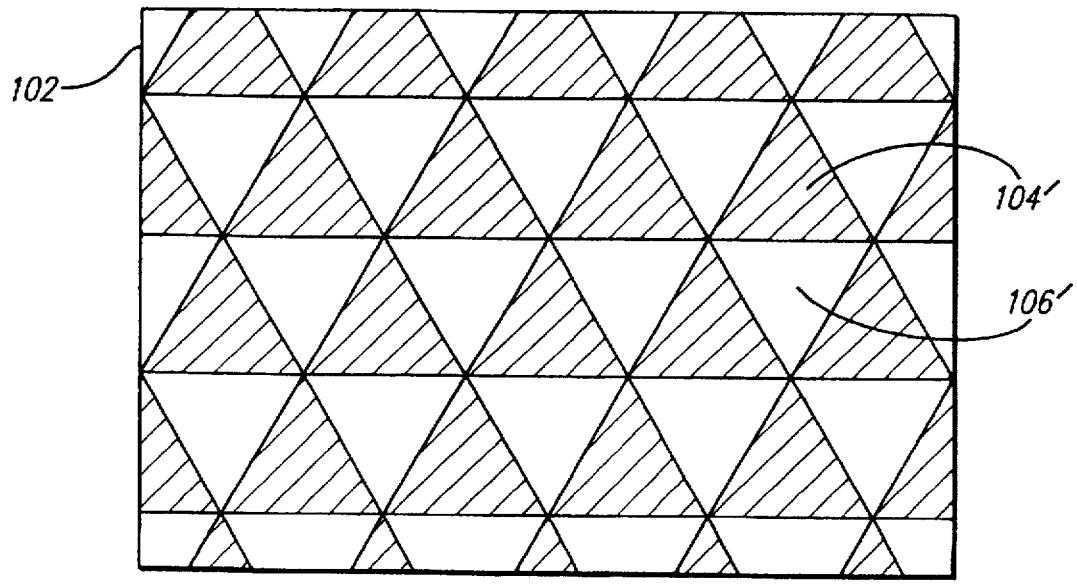
Figure 30:
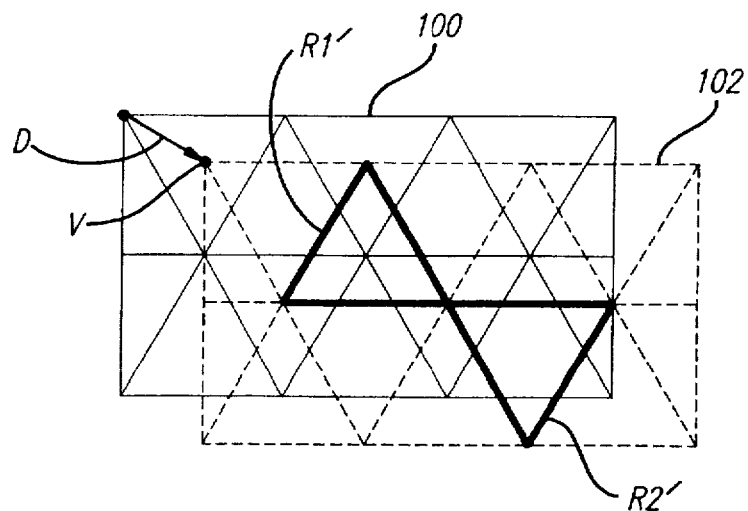
FIG. 30 is a diagram illustrating how the jiggle of FIG. 29 is translated from the jiggle of FIG. 28.

FIG. 29 illustrates a second jiggle 102 which is offset from the first jiggle 100 as illustrated in FIG. 30. More specifically, the jiggle 102 is translated in the direction of an arrow D such that a vertex of a region of the jiggle 102 coincides with a center of a region of the jiggle 100 as indicated at V. The center of an equilateral triangle is defined as the intersection of lines extending from the vertices to the midpoints of the opposite sides.

It will be noted that the arrow D extends perpendicular to the edges of the regions which slant upwardly and rightwardly as viewed in the drawing. The displacement angle is 30° clockwise, and the amount of displacement is S/sqr(3), where S is the length of a side of the regions, and "sqr" denotes square "root".

Figure 31A:
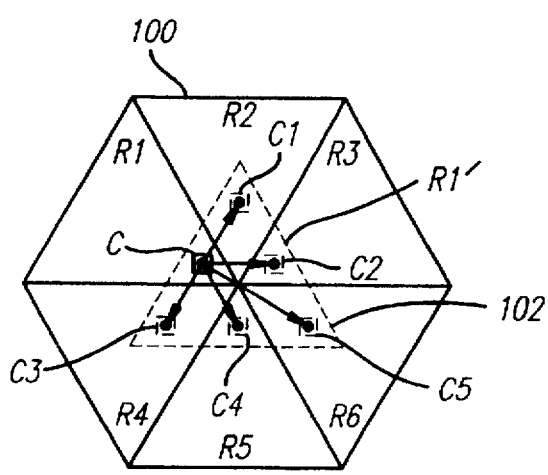
FIGS. 31a and 31b are diagrams illustrating how a cell in one region can be moved to any of five adjacent regions.
Figure 31B:
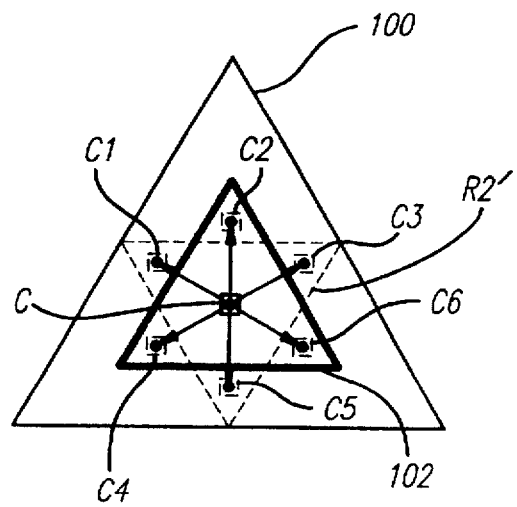

The overlap provided by the jiggles 100 and 102 is illustrated in FIGS. 31a and 31b. A cell C, for example, is able to move from an initial location in a region R1 to locations C1 to C5 in regions R2, R3, R4, R5 and R6 respectively which are overlapped by a region R1' of the jiggle 102.

In other words, overlap is provided for six adjacent regions. It will be noted that the overlap is greater for three of the regions than for the alternating three regions. FIG. 31b shows how a region R2' of the jiggle 102 which overlaps the regions of the jiggle 100 in a different manner also enable a cell C to move to locations C1 to C6 in different regions of the jiggle 100.

As with the rectangular embodiment of the invention, the triangular configuration can be implemented with more than two jiggles. FIGS. 32 to 37 illustrate an embodiment using four jiggles.

Figure 32:
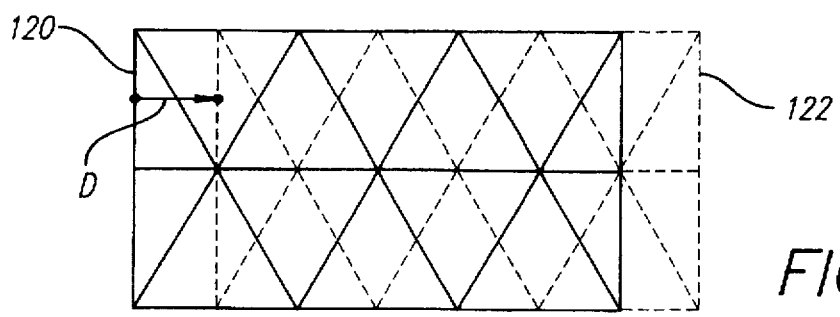
FIG. 32 is a diagram illustrating how the jiggle of FIG. 29 can be translated horizontally from the jiggle of FIG. 28.
Figure 33:
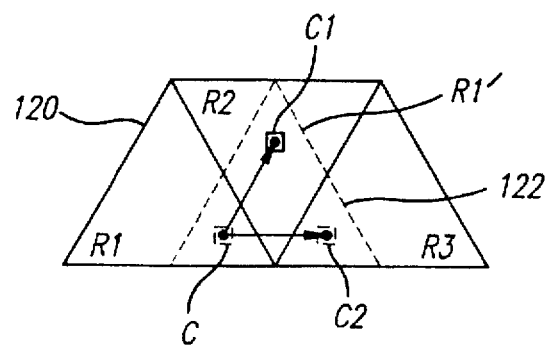
FIG. 33 is a diagram illustrating how a cell in one region can be moved to any of two adjacent regions.

In FIG. 32, a second jiggle 122 is translated horizontally from a first jiggle 120 as indicated by an arrow D. The amount of translation is one-half pitch, or one-half the length of a side S of the regions. As illustrated in FIG. 33, a region R1' of the jiggle 122 overlaps regions R1, R2, and R3 of the jiggle 120 such that a cell C, for example, can move to locations C1 and C2. It will be noted that the amount of vertical overlap is greater than the amount of horizontal overlap.

Figure 34:
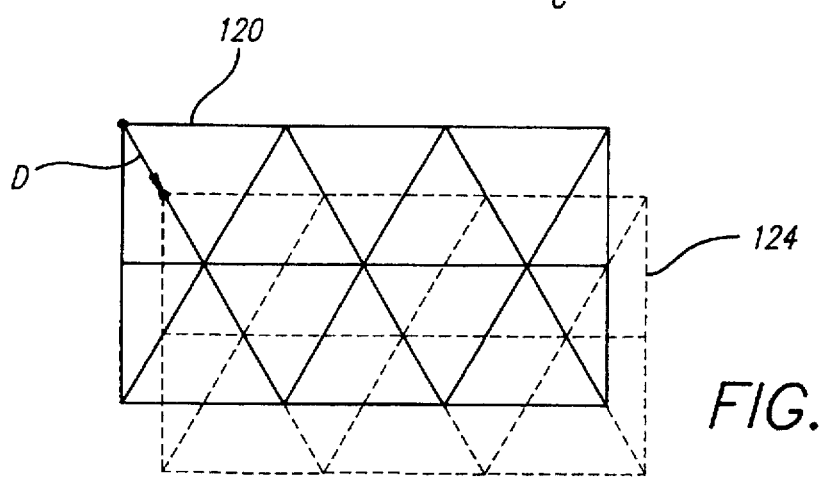
FIG. 34 is a diagram illustrating how the jiggle of FIG. 29 can be translated rightward and downward from the jiggle of FIG. 28.
Figure 35:
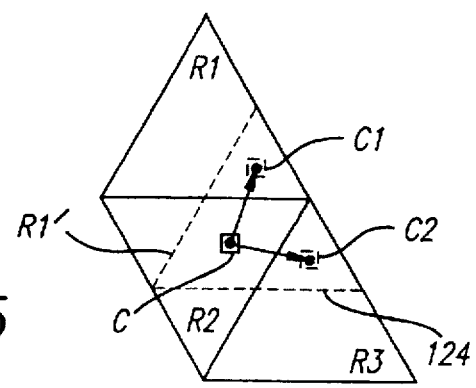
FIG. 35 is a diagram illustrating how a cell in one region can be moved to any of two adjacent regions.

FIG. 34 illustrates a third jiggle 124 which is translated downwardly and rightwardly from the jiggle 120 as indicated by an arrow D. The translation is parallel to the edges of the regions which slant rightwardly and downwardly. FIG. 35 illustrates the overlap, and possible movement of a cell C to locations C1 and C2. The overlap asymmetry is similar to that of FIGS. 32 and 33, but rotated clockwise by 60°.

Figure 36:
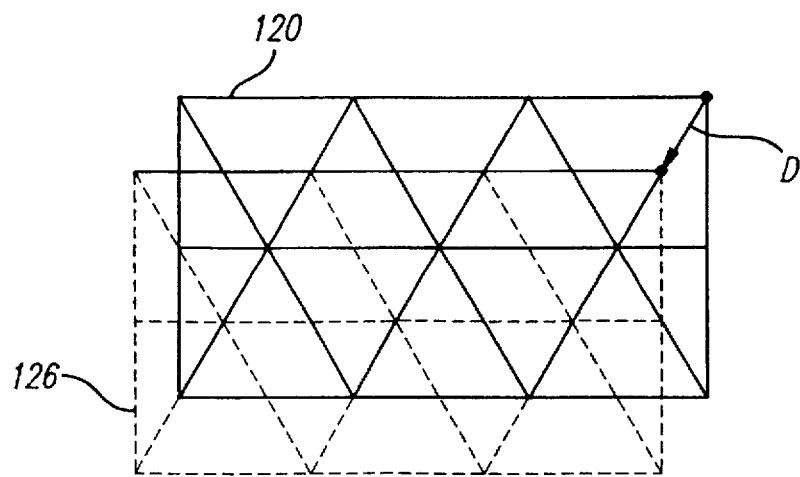
FIG. 36 is a diagram illustrating how the jiggle of FIG. 29 can be translated leftward and downward from the jiggle of FIG. 28.
Figure 37:
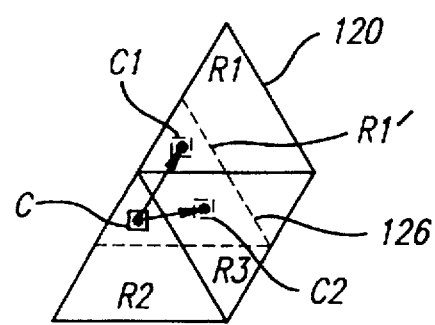
FIG. 37 is a diagram illustrating how a cell in one region can be moved to any of two adjacent regions.

FIG. 36 illustrates a fourth jiggle 126 which is translated leftwardly and downwardly from the jiggle 120 as indicated by an arrow D. The translation is parallel to the edges of the regions which slant leftwardly and downwardly. FIG. 37 illustrates the overlap, and possible movement of a cell C to locations C1 and C2. The overlap asymmetry is similar to that of FIGS. 32 and 33, but rotated clockwise by 210°.

Various modifications will become possible for those skilled in the art after receiving the teachings of the present disclosure without departing from the scope thereof.

For example, it is within the scope of the invention to provide regions which are not regular, such as rectangles having an aspect ratio other than zero, non-regular hexagons, and non-equilateral triangles. It is also within the scope of the invention to provide the jiggles having regions having different sizes than the regions of other jiggles.

We claim:

1. A method of providing an initial temperature in a simulated annealing process, comprising the steps of:

(a) providing a placement of cells on the chip;

(b) performing simulated annealing on the cells using a current temperature without exchanging cell positions;

(c) computing a current cost function for the placement;

(d) changing said current temperature in accordance with said cost function; and (e) repeating steps (b) to (d) until said current cost function satisfies a predetermined criterion, wherein said current temperature is used as said initial temperature for said simulated annealing process when said predetermined criterion is satisfied.

2. A method as in claim 1, in which said predetermined criterion is such that a change in said cost function is less than a predetermined value.

3. A method as in claim 1, further comprising the step, performed between steps (a) and (b), of:

(f) dividing the chip into a set of first regions, and a set of second regions that spatially alternate with the first regions;

in which step (b) comprises the substeps of:

(b1) performing simulated annealing on cells in the first regions; and (b2) performing simulated annealing on cells in the second regions.

4. A method as in claim 3, in which the first regions do not have edges that are common to edges of other first regions, and the second regions do not have edges that are common to edges of other second regions.

5. A method as in claim 3, in which:

step (f) further comprises dividing the chip into a set of third regions, and a set of fourth regions that spatially alternate with the third regions, such that the third regions overlap the first and second regions, and the fourth regions also overlap the first and second regions; and step (b) further comprises the substeps of:

(b3) performing simulated annealing on cells in the third regions; and (b4) performing simulated annealing on cells in the fourth regions.

6. A method as in claim 3, in which steps (b1) and (b2) comprise performing simulated annealing on pluralities of the first and second regions simultaneously using pluralities of parallel processors respectively.

7. A method as in claim 6, further comprising the step of:

(g) assigning approximately equal total areas of cells to the parallel processors respectively.

8. A method as in claim 6, further comprising the step of:

(g) assigning approximately equal numbers of regions to the parallel processors respectively.

9. A method as in claim 6, in which:

steps (b1) and (b2) comprise performing simulated annealing based on a copy of the entire chip; and the method further comprises the steps of:

(g) after performing step (b1), updating said copy; and (h) after performing step (b2), updating said copy.

10. A method of designing an integrated circuit chip dependent on claim 1, comprising the steps of:

providing an initial temperature in accordance with the steps (a) through (e) of the method of claim 1;

(f) performing simulated annealing on the cells including exchanging cell positions;

(g) computing a new temperature in accordance with a number of accepted swaps; and (h) repeating steps (f) and (g) until a difference between consecutive values of said new temperature computed in step (g) satisfies a predetermined criterion.

11. A programmed digital computer as in claim 1, in which said predetermined criterion is such that a change in said cost function is less than a predetermined value.

12. A programmed digital computer as in claim 1, in which the processing means, memory means and program operating in combination further perform the step, between steps (a) and (b), of:

(f) dividing the chip into a set of first regions, and a set of second regions that spatially alternate with the first regions;

in which step (b) comprises the substeps of:

(b1) performing simulated annealing on cells in the first regions; and (b2) performing simulated annealing on cells in the second regions.

13. A programmed digital computer as in claim 12, in which the first regions do not have edges that are common to edges of other first regions, and the second regions do not have edges that are common to edges of other second regions.

14. A programmed digital computer as in claim 12, in which:

step (f) further comprises dividing the chip into a set of third regions, and a set of fourth regions that spatially alternate with the third regions, such that the third regions overlap the first and second regions, and the fourth regions also overlap the first and second regions; and step (b) further comprises the substeps of:

(b3) performing simulated annealing on cells in the third regions; and (b4) performing simulated annealing on cells in the fourth regions.

15. A programmed digital computer as in claim 12, in which:

the processing means comprises a plurality of parallel processors; and steps (b1) and (b2) comprise performing simulated annealing on pluralities of the first and second regions simultaneously using the parallel processors respectively.

16. A programmed digital computer as in claim 15, in which the processing means, memory means and program operating in combination further perform the step of:

(g) assigning approximately equal total areas of cells to the parallel processors respectively.

17. A programmed digital computer as in claim 15, in which the processing means, memory means and program operating in combination further perform the step of:

(g) assigning approximately equal numbers of regions to the parallel processors respectively.

18. A programmed digital computer as in claim 15, in which:

steps (b1) and (b2) comprise performing simulated annealing based on a copy of the entire chip; and the processing means, memory means and program operating in combination further perform the steps of:

(g) after performing step (b1), updating said copy; and (h) after performing step (b2), updating said copy.

19. A method as in claim 1, wherein said placement of cells of step (a) results in an original cost function, and said predetermined criterion is defined as when the current cost function is substantially equal to the original cost function.

20. A method as in claim 19, wherein said changing said current temperature of step (d) includes reducing the current temperature if the current cost function is higher than the original cost function.

21. A method as in claim 20, wherein said changing said current temperature of step (d) includes increasing the current temperature if the current cost function is lower than the original cost function.

22. A programmed digital computer as in claim 1, wherein said placement of cells of step (a) results in an original cost function, and said predetermined criterion is defined as when the current cost function is substantially equal to the original cost function.

23. A programmed digital computer as in claim 22, wherein said changing said current temperature of step (d) includes reducing the current temperature if the current cost function is higher than the original cost function.

24. A programmed digital computer as in claim 23, wherein said changing said current temperature of step (d) includes increasing the current temperature if the current cost function is lower than the original cost function.

25. A programmed digital computer for designing an integrated circuit chip, comprising:

memory means for storing a program including instructions and data; and processing means for executing the program;

the processing means, memory means and program operating in combination for performing the steps of:

(a) providing a placement of cells on the chip;

(b) performing simulated annealing on the cells using a current temperature without exchanging cell positions;

(c) computing a current cost function for the placement;

(d) changing said current temperature in accordance with said cost function; and (e) repeating steps (b) to (d) until said current cost function satisfies a predetermined criterion, wherein the current temperature is used as an initial temperature for a simulated annealing process when said predetermined criterion is satisfied.

26. A programmed digital computer as in claim 25, in which the processing means, memory means and program operating in combination further perform the step, after step (e), of:

(f) performing simulated annealing on the cells including exchanging cell positions;

(g) computing a new temperature in accordance with a number of accepted swaps; and (h) repeating steps (f) and (g) until a difference between consecutive values of said new temperature computed in step (g) satisfies a predetermined criterion.

27. A method of designing an integrated circuit chip, comprising the steps of:

(a) providing a placement of cells on the chip;

(b) dividing the chip into a set of first, second, third and fourth regions, wherein the second regions spatially alternate with the first regions, and wherein the fourth regions spatially alternate with the third regions, such that the third regions overlap the first and second regions, and the fourth regions also overlap the first and second regions;

(c) performing simulated annealing on cells in the first, second, third and fourth regions using an initial temperature without exchanging cell positions;

(d) computing a cost function for the placement;

(e) computing a new temperature in accordance with said cost function; and (f) repeating steps (c) to (e) until said cost function satisfies a predetermined criterion.

28. A programmed digital computer for designing an integrated circuit chip, comprising:

memory means for storing a program including instructions and data; and processing means for executing the program, wherein the processing means, memory means and program operate in combination for performing the steps of:

(a) providing a placement of cells on the chip;

(b) dividing the chip into a set of first, second, third and fourth regions, wherein the second regions spatially alternate with the first regions, and wherein the fourth regions spatially alternate with the third regions, such that the third regions overlap the first and second regions, and the fourth regions also overlap the first and second regions;

(c) performing simulated annealing on cells in the first, second, third and fourth regions using an initial temperature without exchanging cell positions;

(d) computing a cost function for the placement;

(e) computing a new temperature in accordance with said cost function; and (f) repeating steps (c) to (e) until said cost function satisfies a predetermined criterion.

* * * * *